United States Patent
Zenke

Patent Number: 5,700,710
Date of Patent: Dec. 23, 1997

[54] PROCESS OF FABRICATING CAPACITOR HAVING WAVED ROUGH SURFACE OF ACCUMULATING ELECTRODE

[75] Inventor: Masanobu Zenke, Tokyo, Japan

[73] Assignee: NEC Corporation, Tokyo, Japan

[21] Appl. No.: 553,981

[22] Filed: Nov. 6, 1995

[30] Foreign Application Priority Data

Nov. 11, 1994 [JP] Japan ................... 6-277778

[51] Int. Cl.⁶ ................................................. H01L 21/70
[52] U.S. Cl. ........................... 437/60; 437/919; 437/977
[58] Field of Search .............................. 437/60, 52, 919, 437/977; 148/DIG. 138; 257/309

[56] References Cited

U.S. PATENT DOCUMENTS

| | | | |
|---|---|---|---|
| 5,232,876 | 8/1993 | Kim et al. | 437/919 |
| 5,266,514 | 11/1993 | Tuan et al. | 437/52 |
| 5,387,531 | 2/1995 | Rha et al. | 437/977 |
| 5,554,557 | 9/1996 | Koh | 437/60 |
| 5,622,888 | 4/1997 | Sekine et al. | 437/977 |

FOREIGN PATENT DOCUMENTS

| | | | |
|---|---|---|---|
| 3-139882 | 6/1991 | Japan . | |
| 4-214666 | 8/1992 | Japan . | |
| 4-242967 | 8/1992 | Japan . | |
| 5-175450 | 7/1993 | Japan . | |
| 5-175456 (A) | 7/1993 | Japan | 437/977 |
| 6-45521 (A) | 2/1994 | Japan | 437/977 |

Primary Examiner—John Niebling
Assistant Examiner—S. Mulpuri
Attorney, Agent, or Firm—Sughrue, Mion, Zinn, Macpeak & Seas, PLLC

[57] ABSTRACT

Crystal grains of a lower polysilicon layer is grown through an annealing or an ion-implantation before separation of the lower polysilicon layer into doped silicon pieces, an upper polysilicon layer with small crystal grains is deposited over the doped silicon pieces so as to wave at long intervals, and the upper polysilicon layer is roughened so as to wave at short intervals, thereby increasing the surface area of an accumulating electrode of a capacitor.

14 Claims, 8 Drawing Sheets

PROCESS OF FABRICATING CAPACITOR HAVING WAVED ROUGH SURFACE OF ACCUMULATING ELECTRODE

FIELD OF THE INVENTION

This invention relates to a process of fabricating a semiconductor device and, more particularly, to a process of fabricating a capacitor having a waved rough surface of an accumulating electrode for increasing the capacitance.

DESCRIPTION OF THE RELATED ART

A semiconductor dynamic random access memory device store bits of data information in the form of electric charge, and a large number of storage capacitors are fabricated on a semiconductor substrate together with other circuit components. The semiconductor dynamic random access memory device has progressively increased the memory cells, and the area assigned to each memory cell is presently very narrow. For this reason, the stacked type storage capacitor and the trench type storage capacitor are employed in the semiconductor dynamic random access memory device commercially available.

The stacked type storage capacitor is fabricated as follows. When a field effect switching transistor is formed on the semiconductor substrate, an inter-level insulating layer is deposited over the entire surface of the structure, and the inter-level insulating layer covers the field effect switching transistor. The stacked type storage capacitor is fabricated on the inter-level insulating layer.

In detail, polysilicon is deposited over the inter-level insulating layer, and phosphorous is doped into the polysilicon layer. An appropriate photo-resist mask is provided through lithographic techniques, and partially covers the doped polysilicon layer. The exposed portion of the doped polysilicon layer is removed through a plasma-assisted etching, and the photo-resist mask is removed from an accumulating electrode formed from the doped polysilicon. A dielectric film structure such as a combination of a silicon nitride film and a silicon oxide film covers the accumulating electrode, and a counter electrode is provided on the dielectric film structure as similar to the accumulating electrode.

Thus, the stacked type storage capacitor is fabricated on the inter-level insulating layer, and the field effect switching transistor is overlapped with the stacked type storage capacitor. For this reason, the memory cell, i.e., the combination of the field effect switching transistor and the storage capacitor merely occupies narrow real estate.

Using the stacked type storage capacitor, the manufacturer decreases the occupation area without reduction of the capacitance of the storage capacitor. However, the above described stacked type storage capacitor reaches the limit, is hardly available for a 64 mega-bit semiconductor dynamic random access memory device because of insufficient capacitance.

The capacitance is proportional to the amount of area of the accumulating electrode opposed to the counter electrode, and a rough surface is effective against the reduction of the capacitance.

One of the storage capacitor with a rough surface is disclosed in Japanese Patent Publication of Unexamined Application No. 3-139882, which is hereinbelow referred to as "first prior art". According to the Japanese Publication of Unexamined Application, hot phosphoric acid roughens the surface of the accumulating electrode of polysilicon.

A similar technology is disclosed in U.S. Pat. No. 5,266,514. The U.S. Patent teaches hot phosphoric acid etches boundaries of polysilicon so as to roughen the surface of the polysilicon layer.

Japanese Patent Publication of Unexamined Application No. 4-242967, which is referred to as "second prior art", also discloses a roughening technique for the accumulating electrode of polysilicon. A polysilicon layer deposited for the accumulating electrode is firstly oxidized, and the silicon oxide is removed from the polysilicon layer. Small recesses take place in the polysilicon layer after the removal of the silicon oxide, and the accumulating electrode is increased in surface area.

Japanese Patent Publication of Unexamined Application No. 4-214666, which is referred to as "third prior art" discloses another roughening technique for the accumulating electrode. The Japanese Patent Publication proposes to deposit silicon oxide through a normal-pressure chemical vapor deposition using tetraethoxy-silane-ozone (TEOS-$O_3$). The silicon oxide forms a wave-like rise and fall surface, and the rough surface is transferred to a surface of a polysilicon layer deposited over the silicon oxide layer.

The first to third prior arts fairly increase the surface area of the accumulating electrodes one point half times to three times larger than the accumulating electrode with the flat surface, and are available for the storage capacitor of the 64 mega-bit semiconductor dynamic random access memory device. However, a memory cell for the next generation, i.e., a 256 mega-bit semiconductor dynamic random access memory device is assigned much narrower area than that of the 64 mega-bit semiconductor dynamic random access memory device, and the accumulating electrodes formed through the first to third prior arts are insufficient to the 256 mega-bit semiconductor dynamic random access memory device.

Japanese Patent Publication of Unexamined Application No. 5-175450, which is hereinbelow referred to "fourth prior art", teaches an attractive fabrication process for the storage capacitor, and the accumulating electrode with the rough surface is two times to four times wider than the accumulating electrode with the flat surface.

FIGS. 1A to 1C illustrate the process sequence disclosed in Japanese Patent Publication of Unexamined Application No. 5-175450.

A silicon oxide layer 1 covers a silicon substrate 2, and a contact hole 1a is formed in the silicon oxide layer 1 by using lithographic techniques and a dry etching. Subsequently, a silicon layer 3 covers the entire surface of the structure through a low-pressure chemical vapor deposition. Namely, silane gas ($SiH_4$) is introduced into the reactor of the low-pressure chemical vapor deposition system, and the reactor is maintained at 0.2 torr. The silane is decomposed at 575 degrees centigrade, and amorphous silicon is deposited to 100 nanometers thick over the entire surface of the structure. The amorphous silicon layer is annealed in vacuum for 15 minutes, and the amorphous silicon layer is converted to the silicon layer 3. The upper surface of the silicon layer 3 rises and falls at long intervals as shown in FIG. 1A, and the peak-to-bottom is of the order of 0.2 micron.

The silicon substrate 1A is taken out from the reactor to the atmosphere, and the silicon layer 3 is laminated by another silicon layer with a rough surface. The upper silicon layer is also deposited to 30 nanometers thick through the low-pressure chemical vapor deposition followed by the annealing. The silane gas is regulated to 0.2 torr, and the silane is decomposed at 570 degrees centigrade. The amorphous silicon is deposited, and the amorphous silicon layer is annealed for 5 minutes. The surface of the upper silicon layer rises and falls at short intervals. A dopant impurity is introduced into the lower and upper silicon layers, and the lower and upper silicon layers are patterned into an accumulating electrode 4 consisting of the lower silicon layer 3a and the upper silicon layer 4a as shown in FIG. 1B.

Subsequently, a dielectric layer 5 is formed on the accumulating electrode 4, and a counter electrode 6 is patterned on the dielectric layer 5. The rough surface of the accumulating electrode is opposed through the dielectric layer 5 to the counter electrode 6 as shown in FIG. 1C, and the capacitance of the storage capacitor is increased by the rough surface of the accumulating electrode 4.

The prior art process achieves a rough surface for the accumulating electrode 2 times to 4 times wider than the flat surface of the accumulating electrode. However, the manufacturer needs to strictly control the process, because the depositing conditions for the upper silicon layer are only different in the decomposition temperature by 5 degrees centigrade from the depositing conditions for the lower silicon layer. Especially, while amorphous silicon is being concurrently deposited on 100 to 150 silicon wafers, the reaction chamber is locally different in temperature by several degrees centigrade so as to uniformly deposit the amorphous silicon on all of the silicon wafers. However, the temperature difference falls within the difference in process conditions between the lower amorphous silicon layer and the upper amorphous silicon layer, and makes the rough surfaces on the silicon wafers different. Thus, the fourth prior art process is merely available in laboratories, and is not appropriate to a commercial plant.

SUMMARY OF THE INVENTION

It is therefore an important object of the present invention to provide a process of fabricating a capacitor which is highly reliable and commercially available for fabricating a capacitor.

To accomplish the object, the present invention proposes to laminate a layer of large grains and a polysilicon layer with small grains so as to wave a surface of the polysilicon layer.

In accordance with the present invention, there is provided a process of fabricating a capacitor, comprising the steps of: a) preparing a lower structure where the capacitor is fabricated; b) forming a first doped polysilicon layer having large or first crystal grains on the lower structure; c) separating the first doped polysilicon layer into a plurality of doped silicon pieces; d) covering the plurality of doped silicon pieces with a second doped polysilicon layer having small or second crystal grains, the plurality of doped silicon pieces causing the second doped polysilicon layer to wave at long or first intervals; e) roughening a surface portion of the second doped polysilicon layer so as to wave at short or second intervals; f) successively forming a dielectric film structure and a conductive layer on the second doped polysilicon layer so as to form a laminated structure of the second polysilicon layer covering the plurality of doped silicon pieces, the dielectric film structure and the conductive layer; and g) patterning the laminated structure into the storage capacitor.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1A:
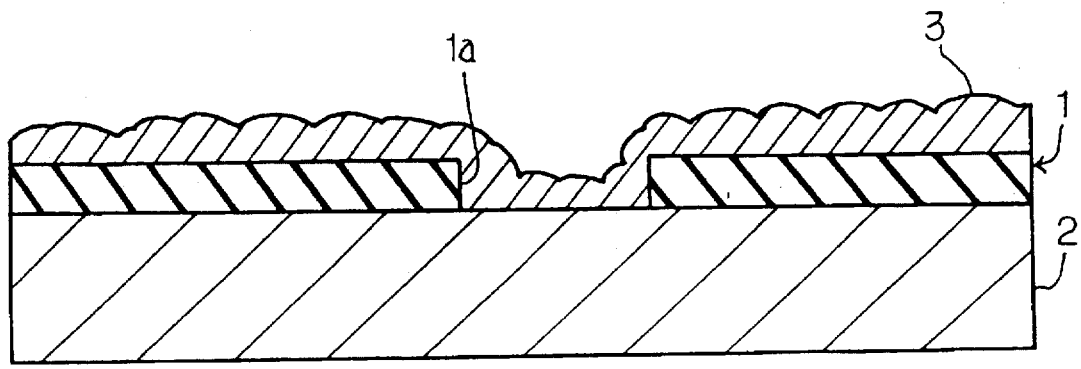
FIGS. 1A to 1C are cross sectional views showing the prior art process sequence of fabricating the storage capacitor.
Figure 1B:
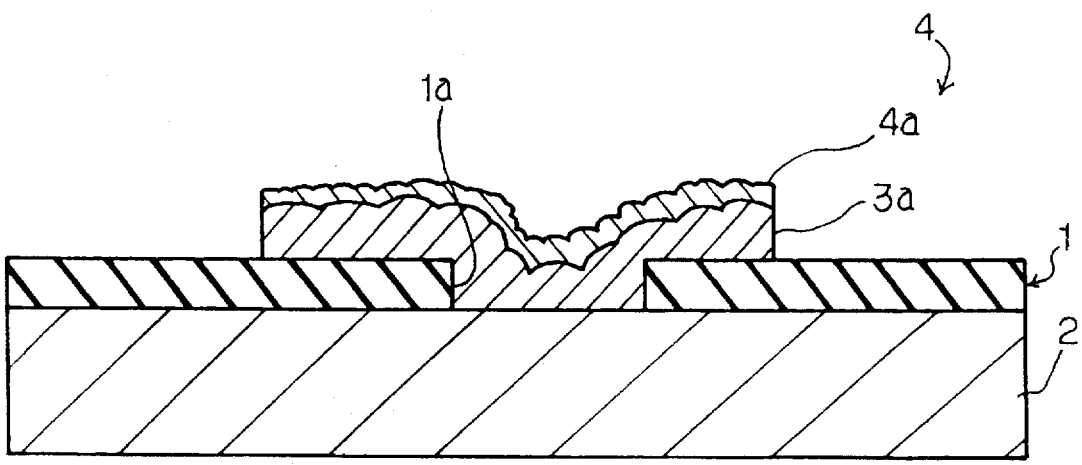
Figure 1C:
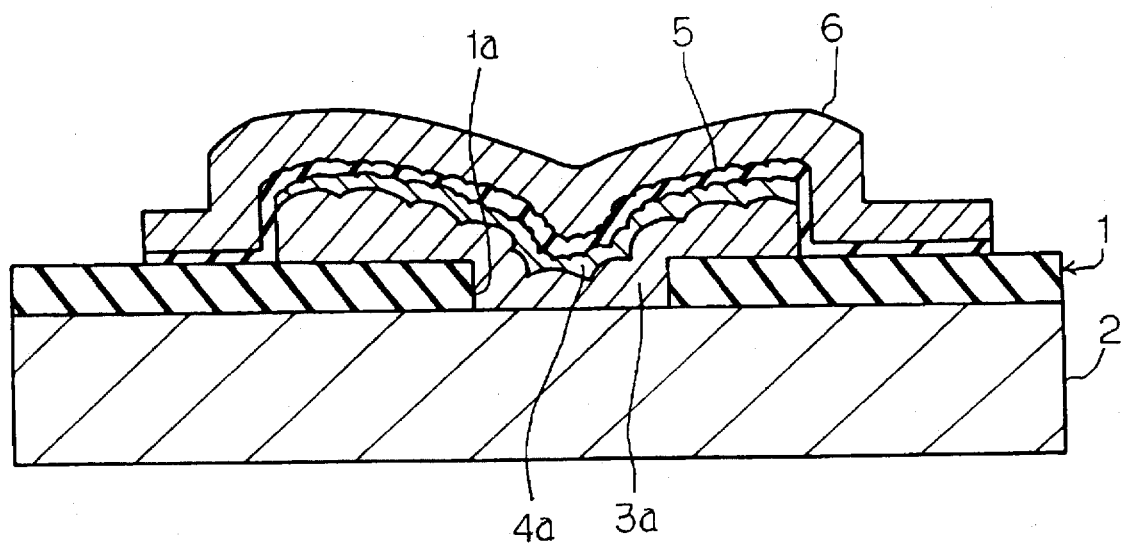

FIGS. 2A to 2E of the drawings illustrate a process of fabricating a storage capacitor embodying the present invention.

The process starts with preparation of a silicon substrate 11, and a field effect transistor (not shown) is firstly fabricated on the silicon substrate 11. The field effect transistor forms in combination a dynamic random access memory cell together with the storage capacitor described hereinbelow.

An inter-level insulating layer 12 is deposited over the entire surface of the structure, and, accordingly, covers the field effect transistor. Though not shown in the drawings, a photo-resist mask is provided on the inter-level insulating layer 12, and exposes an area of the inter-level insulating layer 12 over the source region (not shown) of the field effect transistor. Using the photo-resist mask, the exposed inter-level insulating layer 12 is etched away by using a dry etching technique, and a contact hole 12a is formed in the inter-level insulating layer 12 so as to expose the source region of the field effect transistor.

In this instance, the silicon substrate 11 and the inter-level insulating layer 12 as a whole constitute a lower structure.

Subsequently, the silicon substrate 11 is placed into a reactor of a low-pressure chemical vapor deposition system (not shown), and silane gas ($SiH_4$) or disilane ($Si_2H_6$) mixed with phosphine ($PH_3$) is introduced into the reactor at 0.2 to 1.0 torr. Mixture of amorphous silicon and crystal silicon is deposited to 50 to 200 nanometers thick over the entire surface of the structure at 550 to 600 degrees centigrade. Phosphorous is in-situ doped into the silicon layer, and ranges from $5\times10^{19}$ to $1\times10^{21}$ atoms/cm$^3$.

Figure 2A:
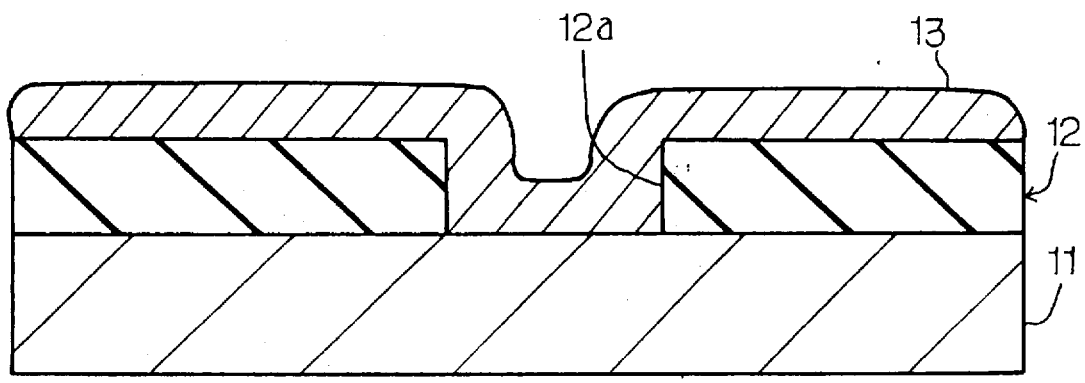
FIGS. 2A to 2E are cross sectional views showing a process sequence of fabricating a storage capacitor according to the present invention.

The silicon layer thus deposited over the entire surface is annealed at 800 to 900 degrees centigrade for 10 to 30 minutes for crystallization, and the first polysilicon layer 13 is held in contact through the contact hole with the source region of the field effect transistor as shown in FIG. 2A. The grains of the first polysilicon layer 13 ranges from 30 nanometers to 2000 nanometers. The phosphorous tends to segregate along the grain boundaries. For this reason, the grain boundaries are heavier in dopant concentration than the other portions of the first polysilicon layer 13.

In this instance, the phosphorous is introduced into the first polysilicon layer 13 through the in-situ doping. However, the silane or disilane may be introduced into the reactor so as to deposit non-doped polysilicon. In case of the non-doped polysilicon, the dopant impurity is diffused or ion implanted into the non-doped polysilicon after the annealing. Moreover, the dopant impurity may be diffused during an annealing for the crystallization. In this case, $PoCl_3$ gas may be mixed into the nitrogen gas.

The phosphorous is introduced into the first polysilicon layer 13 before the annealing, and is distributed over the first polysilicon layer 13. For this reason, most of the grain boundaries are heavily doped with the phosphorous during the heat treatment.

Figure 2B:
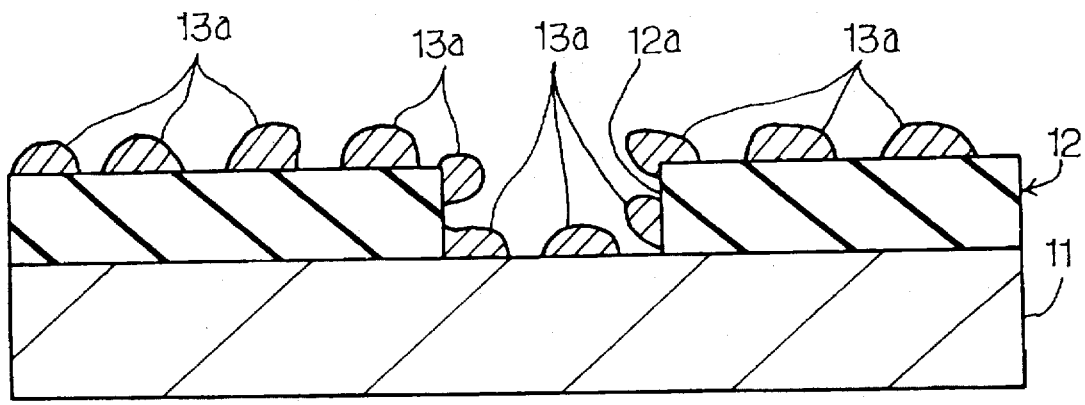

Subsequently, the first polysilicon layer 13 is dipped into concentrated phosphoric acid at 150 to 170 degrees centigrade for 30 to 180 minutes, and the first polysilicon layer 13 is partially etched. The etching rate to the heavily doped grain boundaries is larger than the other lightly doped portion of the first polysilicon layer 13, and the concentrated phosphoric acid selectively removes the grain boundaries. As a result, large silicon pieces 13a are left on the entire surface of the structure like islands as shown in FIG. 2B. The grains usually form the large silicon pieces 13a. Even though several grains are continuous to adjacent grains, there is no problem, and the large silicon pieces 13a contain such large silicon pieces. However, it is desirable to perfectly separate the crystal silicon grains from the adjacent grains, because the perfectly separated grains increase the surface area. Moreover, the etching is easily controllable in view of time.

As described hereinbefore, the phosphorous heavily dopes most of the grain boundaries, and a large number of large silicon pieces 13a take place over the surface of the inter-level insulating layer 12.

Figure 2C:
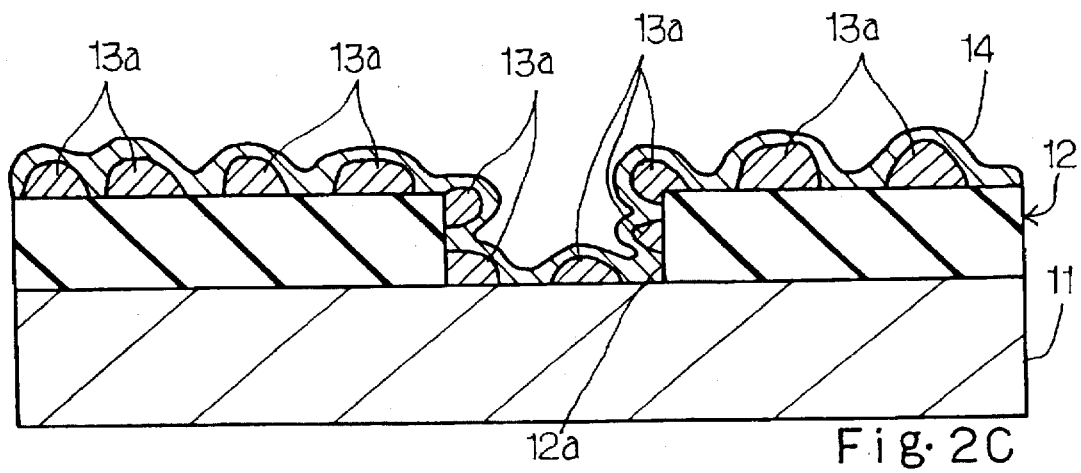

Subsequently, silicon is deposited to 50 to 100 nanometers thick over the entire surface of the structure by using a low-pressure chemical vapor deposition using the silane gas. The silane is decomposed at 600 to 650 degrees centigrade, and a second polysilicon layer 14 covers the crystal large silicon pieces 13a as shown in FIG. 2C. The second polysilicon layer 14 contains grains, because the deposition is carried out at higher temperature than the first polysilicon layer 13. However, the grain size is smaller than those of the first polysilicon layer 13, because the second polysilicon layer 14 is not treated with heat after the deposition. Phosphorous is diffused into the second polysilicon layer 14, and the average phosphorous concentration ranges $10^{20}$ to $10^{21}$ atoms/cm$^3$. The phosphorous is also segregated along the grain boundaries in the second polysilicon layer 14.

Figure 2D:
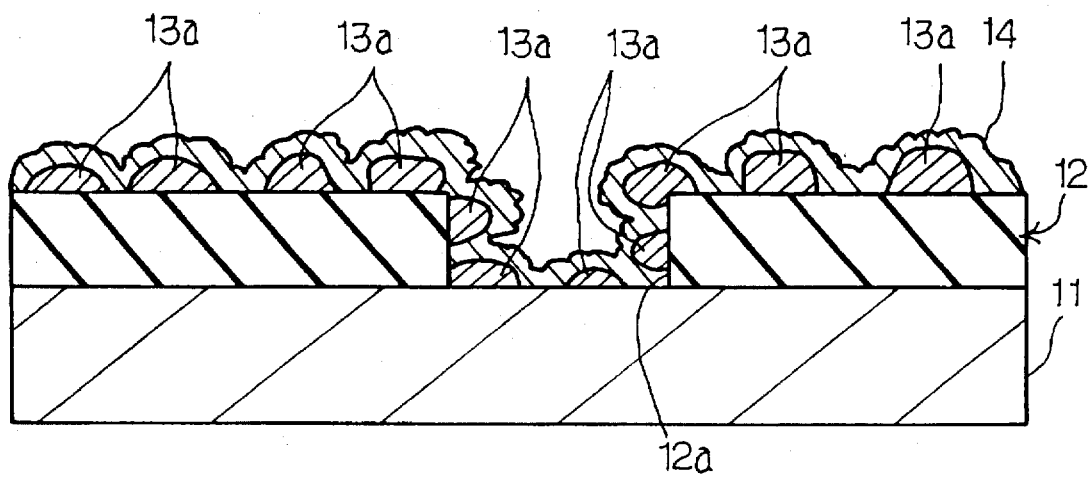
Figure 2E:
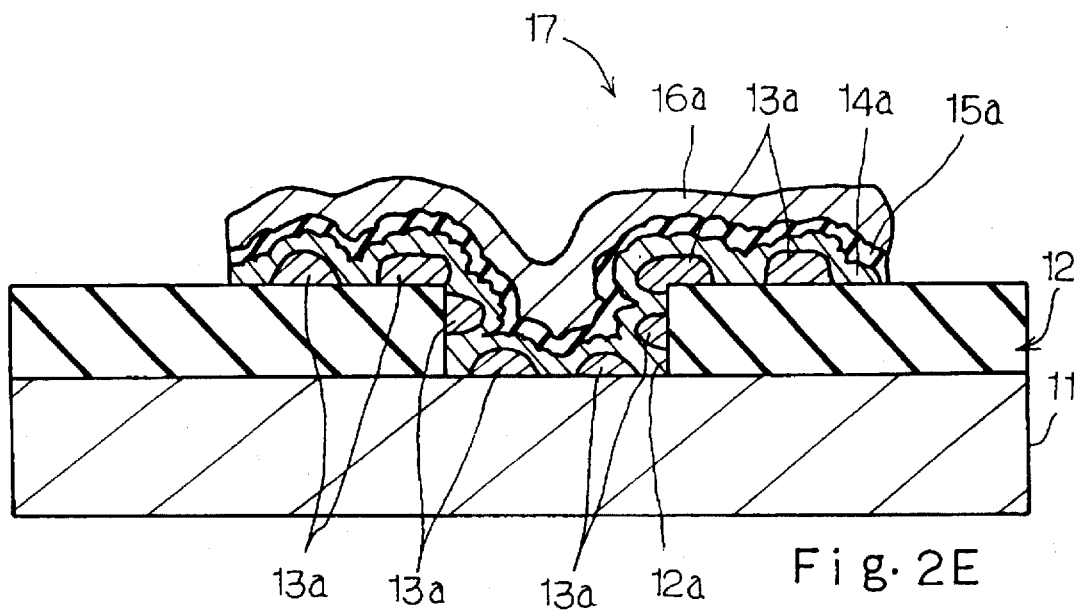

The second polysilicon layer 14 is dipped in the concentrated phosphoric acid at 150 to 170 degrees centigrade for 30 to 120 minutes, and the concentrated phosphoric acid selectively etches the heavily doped grain boundaries. As a result, the second polysilicon layer 14 is roughened as shown in FIG. 2D.

The large silicon pieces 13a cause the second polysilicon layer 14 to wave or rise and fall at long intervals, and the concentrated phosphoric acid roughens the surface of the second polysilicon layer like a ripple. As a result, the surface area of the second polysilicon layer 14 is increased three to four times with respect to the flat accumulating electrode of the prior art capacitor.

Subsequently, silicon nitride is topographically deposited over the entire surface of the structure by using a low-pressure chemical vapor deposition. Namely, the resultant structure is placed in the reactor of the low-pressure chemical vapor deposition system, and gaseous mixture of SiH$_2$Cl$_2$ and NH$_3$ is introduced into the reactor. The surface portion of the silicon nitride layer is thermally oxidized in oxidation atmosphere, and the silicon oxide layer and the silicon nitride layer form in combination a dielectric film structure.

Subsequently, polysilicon is deposited over the dielectric film structure to 100 to 300 nanometers thick through the standard low-pressure chemical vapor deposition, and the dielectric film structure is overlain by the third polysilicon layer. Phosphorous is introduced into the third polysilicon layer.

An appropriate photo-resist mask is provided on the third polysilicon layer by using the lithographic techniques, and the third polysilicon layer, the dielectric film structure, the second polysilicon layer 14 and the large silicon pieces 13a are partially removed through a dry etching. As a result, the third polysilicon layer, the dielectric film structure, the second polysilicon layer 14 and the large silicon pieces 13a are patterned into an accumulating electrode 13a/14a, the dielectric film structure 15a and the counter electrode 16a, and the accumulating electrode 13a/14a, the dielectric film structure 15a and the counter electrode 16a as a whole constitute the storage capacitor 17 according to the present invention.

The present inventor evaluated the storage capacitor 17 and the dielectric film structure. The storage capacitor 17 was three to four times larger in capacitance than the prior art storage capacitor with the flat accumulating electrode of polysilicon, and the dielectric film structure 15a was equal in leakage current and the distribution of withstand voltage to the dielectric film structure of the prior art storage capacitor.

As will be appreciated from the foregoing description, the crystal grains of the first polysilicon layer 13 are grown through the annealing, and the large silicon pieces 13a cause the second polysilicon layer 14 to wave or rise and fall at long intervals. The grain size is determined by whether or not the annealing is carried out, and, for this reason, the manufacturer is not expected to strictly control the depositing conditions between the first polysilicon layer 13 and the second polysilicon layer 14.

Moreover, the standard low-pressure chemical vapor deposition system and the standard diffusion furnace are available for the process according to the present invention, and the production cost is not increased.

Second Embodiment

FIGS. 3A to 3G illustrate another process sequence for fabricating a storage capacitor embodying the present invention. The storage capacitor also form a dynamic random access memory cell together with a field effect transistor (not shown).

The process sequence starts with preparation of a silicon substrate 21, and the field effect transistor is fabricated on the silicon substrate 21. An inter-level insulating layer 22 covers the field effect transistor, and a contact hole 22a is formed in the inter-level insulating layer 22 through the lithography and the etching as similar to the first embodiment. Though not shown in the figures, the source region of the field effect transistor is exposed to the contact hole 22a.

Figure 3A:
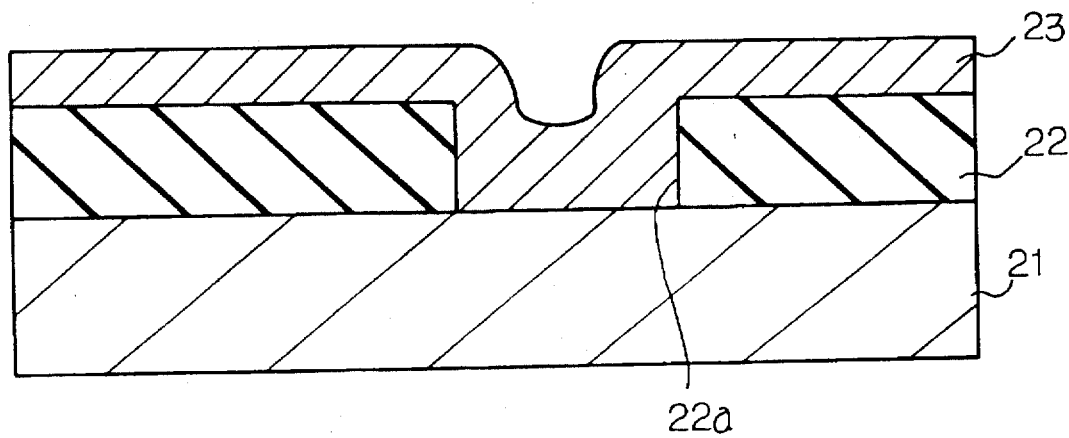
FIG. 3A to 3G are cross sectional views showing another process sequence of fabricating a storage capacitor according to the present invention.

Subsequently, the silicon substrate 21 is placed in a reactor of a standard low-pressure chemical vapor deposition system, and silane gas (SiH$_4$) or disilane gas (Si$_2$H$_6$) is introduced into the reactor. The gas pressure is 0.2 to 1.0 torr, and the silane or the disilane is decomposed at 600 to 650 degrees centigrade so as to deposit a non-doped polysilicon layer 23 to 50 to 200 nanometers thick over the entire surface of the structure as shown in FIG. 3A.

Figure 3B:
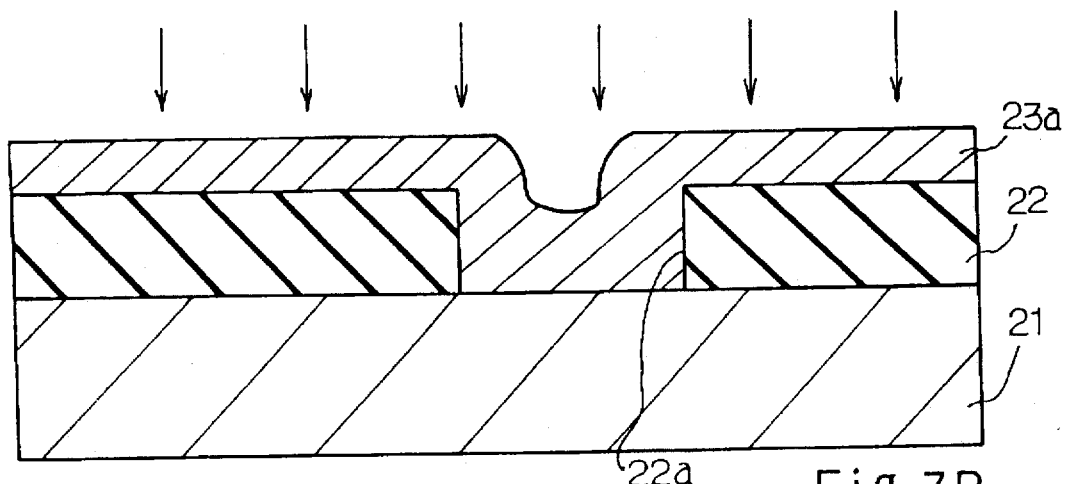

Subsequently, phosphorous is ion implanted into the non-doped polysilicon layer 23 at $5\times10^{19}$ to $1\times10^{21}$ atoms/cm$^3$ as shown in FIG. 3B, and the grains of the non-doped polysilicon layer 23 are grown to those of the first polysilicon layer 13. As a result, the non-doped polysilicon layer 23 is converted to a doped polysilicon layer 23a with large crystal grains, and the phosphorous is segregated along the grain boundaries.

Silicon may be ion implanted into the non-doped polysilicon layer 23 instead of the phosphorous so as to enlarge the crystal grains. In this instance, if the resistance is too high to serve as an accumulating electrode, n-type dopant impurity such as phosphorous is introduced through a diffusion after the ion-implantation of silicon. The dopant impurity is also segregated along grain boundaries.

Figure 3C:
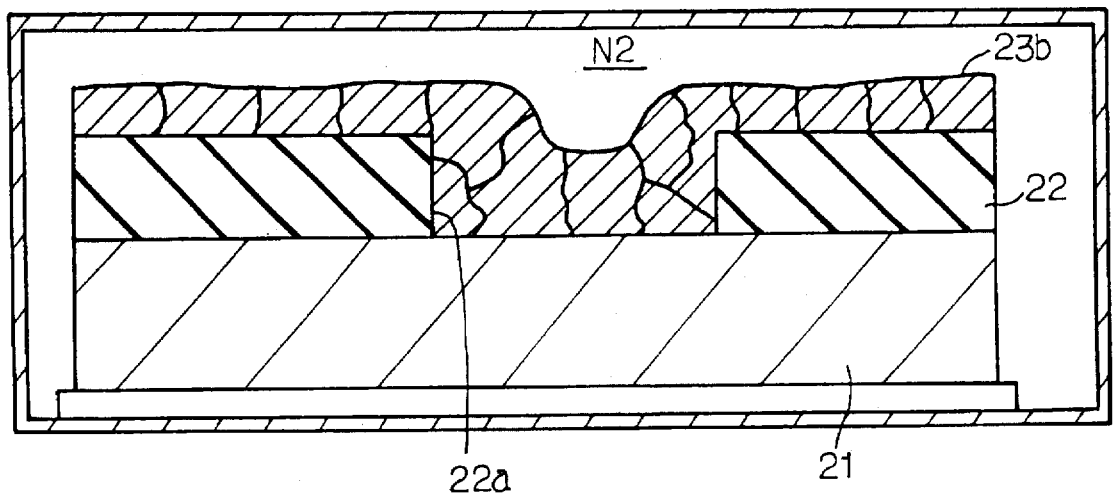

The doped polysilicon layer 23a is available without a heat treatment, because the crystal grains are large enough to cause an upper polysilicon layer to wave at long interval. However, the doped polysilicon layer 23a is annealed in nitrogen atmosphere at 800 to 900 degrees centigrade for 10 to 30 minutes so as to perfectly crystallize the silicon as shown in FIG. 3C. The doped polysilicon 23b thus annealed contains large crystal grains.

Figure 3D:
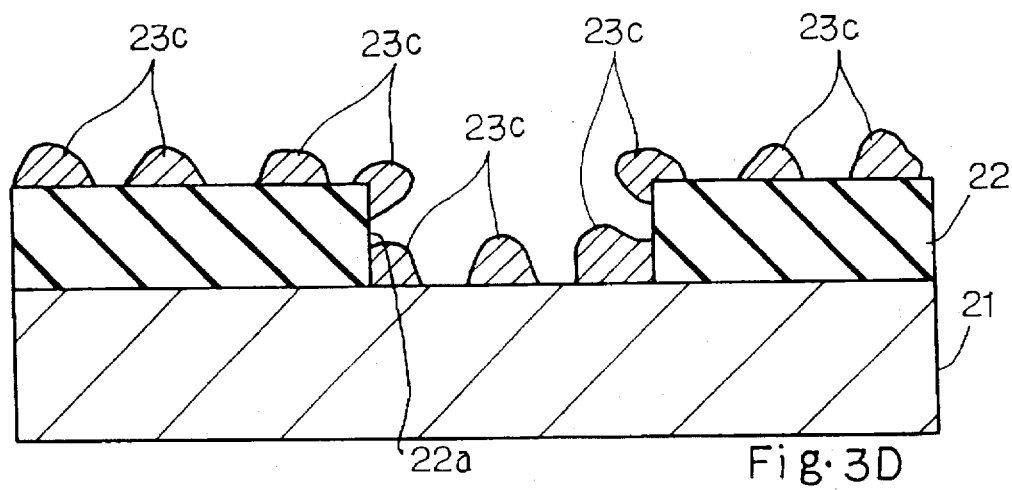

The doped polysilicon layer 23b is dipped into concentrated phosphoric acid at 150 to 170 degrees centigrade for 30 to 180 minutes. The concentrated phosphoric acid selectively removes the grain boundaries, and a plurality of doped silicon pieces 23c are left on the exposed silicon substrate 21 and the inter-level insulating layer 22 like islands as shown in FIG. 3D.

Figure 3E:
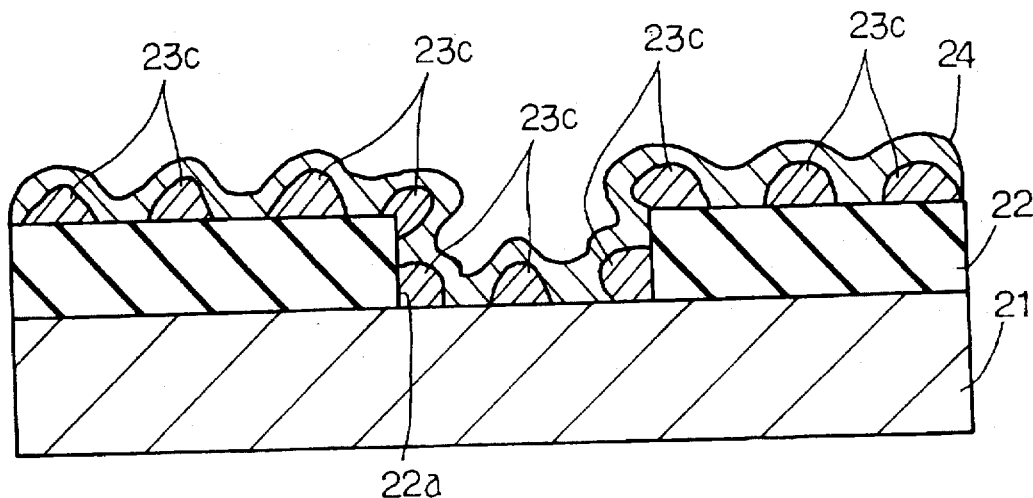

The resultant structure is placed in the reactor of the standard low-pressure chemical vapor deposition system, and silane gas is introduced into the reactor. The silane is decomposed at 600 to 650 degrees centigrade, and polysilicon is deposited to 50 to 100 nanometers thick over the entire surface of the structure as shown in FIG. 3E. The deposited polysilicon forms a second polysilicon layer 24, and the second polysilicon layer 24 contains small crystal grains. The large grains 23c cause the second polysilicon layer 24 to wave at long intervals. Phosphorous is diffused into the second polysilicon layer 24 at $10^{20}$ to $10^{21}$ atoms/$cm^3$, and is segregated along the grain boundaries of the second polysilicon layer 24.

Figure 3F:
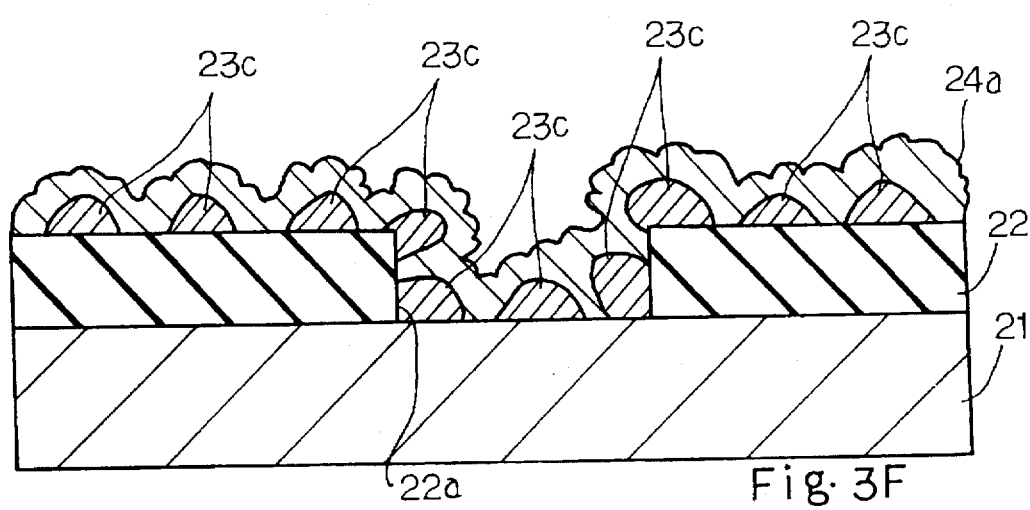
Figure 3G:
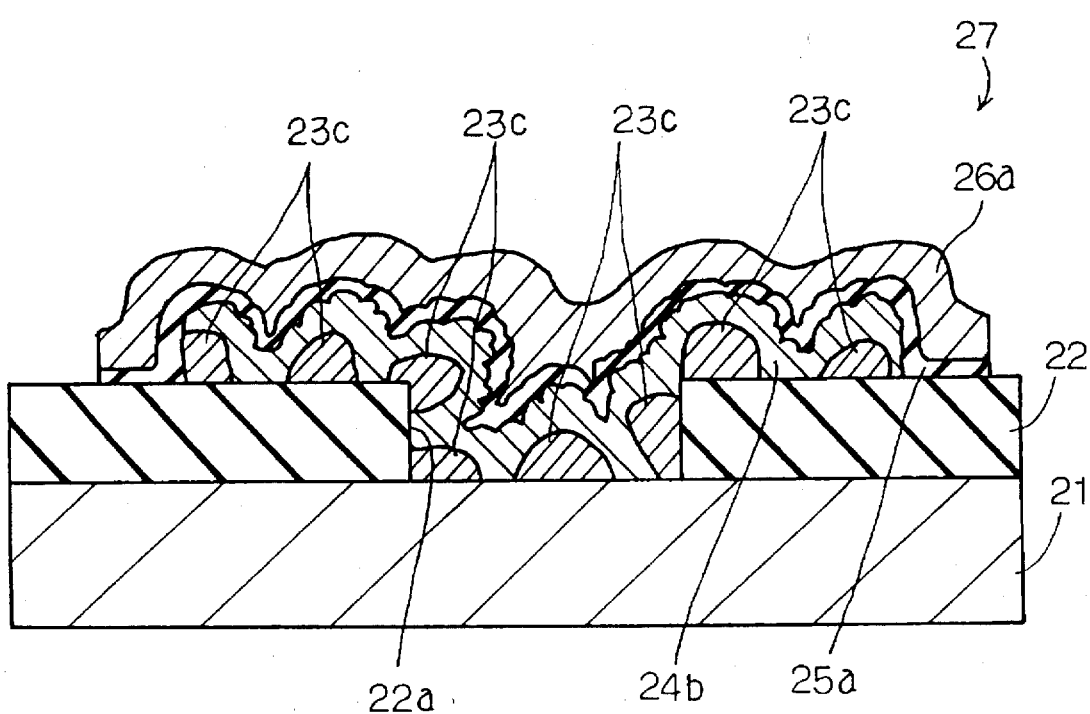

The second polysilicon layer 24 is dipped into the concentrated phosphoric acid at 150 to 170 degrees centigrade for 30 to 120 minutes. Then, the concentrated phosphoric acid etches the grain boundaries, and roughens the surface of the second polysilicon layer 24a as shown in FIG. 3F. The surface of the second polysilicon layer 24a waves or rises and falls at short intervals like a ripple, and the long wave and the short wave increases the surface area of the second polysilicon layer 24a.

Subsequently, silicon nitride is topographically deposited over the entire surface of the structure by using a low-pressure chemical vapor deposition. Namely, the resultant structure is placed in the reactor of the low-pressure chemical vapor deposition system, and gaseous mixture of $SiH_2Cl_2$ and $NH_3$ is introduced into the reactor. The surface portion of the silicon nitride layer is thermally oxidized in oxidation atmosphere, and the silicon oxide layer and the silicon nitride layer form in combination a dielectric film structure.

Subsequently, polysilicon is deposited over the dielectric film structure to 100 to 300 nanometers thick through the standard low-pressure chemical vapor deposition, and the dielectric film structure is overlain by the third polysilicon layer. Phosphorous is introduced into the third polysilicon layer.

An appropriate photo-resist mask is provided on the third polysilicon layer by using the lithographic techniques, and the third polysilicon layer, the dielectric film structure, the second polysilicon layer 24a and the large silicon pieces 23c are partially removed through a dry etching. As a result, the third polysilicon layer, the dielectric film structure, the second polysilicon layer 24a and the large silicon pieces 23c are patterned into an accumulating electrode 23c/24b, the dielectric film structure 25a and the counter electrode 26a, and the accumulating electrode 23c/24b, the dielectric film structure 25a and the counter electrode 26a as a whole constitute the storage capacitor 27 according to the present invention.

The present inventor also evaluated the storage capacitor 27 and the dielectric film structure 25a. The storage capacitor 27 was three to four times larger in capacitance than the prior art storage capacitor with the flat accumulating electrode of polysilicon, and the dielectric film structure 25a was equal in leakage current and the distribution of withstand voltage to the dielectric film structure of the prior art storage capacitor.

As will be appreciated from the foregoing description, the crystal grains of the first polysilicon layer 23b are grown through the ion-implantation or the ion-implantation followed by the annealing, and the large silicon pieces 23c cause the second polysilicon layer 24a to wave or rise and fall at long intervals. The grain size is determined by whether or not the ion-implantation or the ion-implantation followed by the annealing is carried out, and, for this reason, the manufacturer is not expected to strictly control the depositing conditions between the first polysilicon layer 23 and the second polysilicon layer 24. Moreover, the standard low-pressure chemical vapor deposition system and the standard diffusion furnace are available for the process according to the present invention, and the production cost is not increased.

Although particular embodiments of the present invention have been shown and described, it will be obvious to those skilled in the art that various changes and modifications may be made without departing from the spirit and scope of the present invention.

For example, the dielectric film structure may be implemented by a single layer of an insulating substance, and the insulating substance is not limited to the silicon oxide and the silicon nitride.

The impurity is not limited to phosphorous. Either p-type or n-type dopant impurity is introduced into the polysilicon layers. The other dopant impurities are, by way of example, arsenic and boron. $AsH_3$ gas and $BCl_3$ gas may be mixed with the source gas for the polysilicon. Although the phosphorous and the boron are popular to the diffusion, the arsenic, the phosphorous and the boron are widely used in ion-implantation.

The present invention is applicable to any process sequence for fabricating a semiconductor device having a capacitor.

What is claimed is:

1. A process of fabricating a capacitor, comprising the steps of:

a) preparing a lower structure where said capacitor is fabricated;

b) forming a first doped polysilicon layer having first crystal grains on said lower structure;

c) separating said first doped polysilicon layer into a plurality of doped silicon pieces silicon pieces by etching;

d) covering said plurality of doped silicon pieces with a second doped polysilicon layer having second crystal grains, said second crystal grains comprising smaller crystal grains than said first crystal grains, said plurality of doped silicon pieces causing said second doped polysilicon layer to wave at first intervals;

e) roughening a surface portion of said second doped polysilicon layer by etching so as to wave at second intervals, said second intervals being smaller than said first intervals;

f) successively forming a dielectric film structure and a conductive layer on said second doped polysilicon layer so as to form a laminated structure of said second polysilicon layer covering said plurality of doped silicon pieces, said dielectric film structure and said conductive layer; and g) patterning said laminated structure into said storage capacitor, wherein the second polysilicon layer and the first silicon pieces are patterned into an accumulating electrode.

2. The process as set forth in claim 1, in which said step b) comprises the sub-steps of b-1) depositing a layer of an amorphous silicon and a crystal silicon on said lower structure, a first dopant impurity being introduced into said layer of said amorphous silicon and said crystal silicon during the deposition of said layer, and b-2) annealing said layer of said amorphous silicon and said crystal silicon so as to grow grains of said layer to said first crystal grains.

3. The process as set forth in claim 2, in which said layer of said amorphous silicon and said crystal silicon is deposited through a low-pressure chemical vapor deposition using one of silane and disilane, and said first dopant impurity is doped into said layer by mixing a dopant gas into said one of said silane and said disilane.

4. The process as set forth in claim 3, in which said low-pressure chemical vapor deposition is carried out at 550 to 600 degrees centigrade under 0.2 to 1.0 torr.

5. The process as set forth in claim 3, in which said dopant gas is phosphine.

6. The process as set forth in claim 2, in which the annealing at step b-2) is carried out in a nitrogen atmosphere at 800 to 900 degrees centigrade for 10 to 30 minutes.

7. The process as set forth in claim 6, in which said annealing grows said grains to 30 to 2000 nanometers.

8. The process as set forth in claim 5, in which said phosphine dopes a phosphorous into said first doped polysilicon layer, and the separation in said step c) is carried out in concentrated phosphoric acid at 150 to 170 degrees centigrade for 30 to 180 minutes.

9. The process as set forth in claim 1, in which said step b) comprises the sub-steps of b-1) depositing a layer of an amorphous silicon and a crystal silicon on said lower structure, a first dopant impurity being introduced into said layer of said amorphous silicon and said crystal silicon during the deposition of said layer, and b-2) annealing said layer of said amorphous silicon and said crystal silicon so as to grow grains of said layer to said first crystal grains, said step d) comprising the sub-steps of d-1) depositing a layer of polysilicon over said plurality of doped silicon pieces, and d-2) diffusing a second dopant impurity into said layer of polysilicon so as to form said second doped polysilicon layer.

10. The process as set forth in claim 1, in which said step b) comprises the sub-steps of b-1) depositing a layer of non-doped polysilicon on said lower structure, and b-2) implanting an impurity into said layer of said non-doped polysilicon so as to form said first doped polysilicon layer.

11. The process as set forth in claim 10, in which said impurity is selected from the group consisting of phosphorous, silicon, boron and arsenic.

12. The process as set forth in claim 10, in which said step b) further comprises the sub-step of b-3) annealing said first doped polysilicon layer.

13. The process as set forth in claim 10, in which said step b) further comprises the sub-steps of b-3) diffusing a dopant impurity into said first doped polysilicon, and b-4) annealing said first doped polysilicon layer.

14. The process as set forth in claim 1, in which said step b) comprises the sub-steps of b-1) depositing a layer of non-doped polysilicon on said lower structure, b-2) implanting a first impurity into said layer of said non-doped polysilicon so as to form said first doped polysilicon layer, and b-3) annealing said first doped polysilicon so as to grow grains to said first crystal grains, said step d) comprising the sub-steps of d-1) depositing a layer of polysilicon over said plurality of doped silicon pieces, and d-2) diffusing a second impurity into said layer of said polysilicon so as to form said second doped polysilicon layer.

* * * * *